(12) United States Patent
Dyer et al.

(10) Patent No.: US 7,598,572 B2
(45) Date of Patent: Oct. 6, 2009

(54) SILICIDED POLYSILICON SPACER FOR ENHANCED CONTACT AREA

(75) Inventors: Thomas W. Dyer, Pleasant Valley, NY (US); Sunfei Fang, LaGrangeville, NY (US); Ja-Hum Ku, LaGrangeville, NY (US); Yong Meng Lee, Singapore (SG)

(73) Assignees: International Business Machines Corporation, Armonk, NY (US); Samsung Electronic Co., Ltd (Corporation), Suwon-Si, Gyeonggi-Do (KR); Chartered Semiconductor Manufacturing Ltd (Corporation), Singapore (SG)

( * ) Notice: Subject to any disclaimer, the term of this patent is extended or adjusted under 35 U.S.C. 154(b) by 262 days.

(21) Appl. No.: 11/552,673

(22) Filed: Oct. 25, 2006

(65) Prior Publication Data

US 2008/0102612 A1  May 1, 2008

(51) Int. Cl.
*H01L 29/40* (2006.01)

(52) U.S. Cl. ............... 257/365; 438/682; 257/E29.152

(58) Field of Classification Search ........... 257/314, 257/365, E29.026, E21.627; 438/596, 682
See application file for complete search history.

(56) References Cited

U.S. PATENT DOCUMENTS

| | | | |
|---|---|---|---|
| 6,137,149 A | 10/2000 | Kodama | |
| 6,169,017 B1 | 1/2001 | Lee | |
| 6,566,208 B2 | 5/2003 | Pan et al. | |
| 6,727,135 B2 | 4/2004 | Lee et al. | |
| 7,141,849 B2 * | 11/2006 | Iwata et al. | 257/324 |
| 2004/0145009 A1 * | 7/2004 | Min et al. | 257/321 |
| 2006/0073666 A1 * | 4/2006 | Lim et al. | 438/303 |
| 2008/0142867 A1 * | 6/2008 | Lee et al. | 257/315 |
| 2008/0272398 A1 * | 11/2008 | Bronner et al. | 257/205 |

* cited by examiner

*Primary Examiner*—W. David Coleman
(74) *Attorney, Agent, or Firm*—DeLio & Peterson, LLC; Kelly M. Nowak; Yuanmin Cai

(57) ABSTRACT

An integrated circuit device having an increased source/drain contact area by a formed silicided polysilicon spacer. The polysilicon sidewall spacer is formed having a height less than seventy percent of said gate conductor height, and having a continuous surface silicide layer over the deep source and drain regions. The contact area is enhanced by the silicided polysilicon spacer.

2 Claims, 10 Drawing Sheets

SILICIDED POLYSILICON SPACER FOR ENHANCED CONTACT AREA

BACKGROUND OF THE INVENTION

1. Field of the Invention

The present invention relates to the fabrication of integrated circuit devices, particularly to a method of increasing the source/drain contact area, and more particularly to a method of forming a silicided poly spacer for enhanced contact area.

2. Description of Related Art

Transistor fabrication in a smaller size allows a MOS integrated circuit to operate at higher speed. However, the smaller size poses new problems in fabrication and operation. In sub-micron integrated circuit technology, parameters such as source/drain contact area are continually being reduced. In order to enhance the quality of an integrated circuit chip, a silicide layer is formed to reduce the contact resistance at the gate and the source/drain region. The conventional silicide formation process includes simultaneously forming silicide on the source/drain silicon and on the gate polysilicon.

Device roll-off requirements generally demand a 50 nm wide spacer be used for the deep junction implants. However, ground rules typically call for a 192 nm gate poly pitch and a 35 nm physical gate length. This leaves inadequate spacing between minimally spaced gates to align and squarely land contacts on the diffusion between gates, mostly because the area over the source/drain extensions is unavailable to make contact. Landing on the spacer or on the underlying LTO leads to high contact resistance, since this portion of the contact is electrically insulated. Furthermore, trying to etch through these insulators and land on the shallow LDD extension results in punch-through of the contact through the extension profile, and causes high junction leakages. Since CA nitride RIE is designed to stop on silicide, silicide forms an ideal etch-stop. Consequently, landing on the contact on silicide ensures a good electrical connection.

SRAM designs use elongated contacts to strap the gate and the adjacent diffusion of cell device. Printing and etching these elongated CA bars is an on-going challenge in the art. The ability to strap the gate and diffusion with a regularly shaped contact would circumvent these issues.

In U.S. Pat. No. 6,566,208 issued to Pan, et al., on May 20, 2003 entitled, "METHOD TO FORM ELEVATED SOURCE/DRAIN USING POLY SPACER," a gate electrode is formed over a gate dielectric on a semiconductor substrate. A polysilicon layer is deposited overlying the semiconductor substrate, gate electrode, and dielectric spacers wherein the polysilicon layer is heavily doped. The polysilicon layer is then etched back to leave polysilicon spacers.

In U.S. Pat. No. 6,169,017 issued to Lee on Jan. 2, 2001 entitled, "METHOD TO INCREASE CONTACT AREA," a fabrication method is taught to increase the gate contact area in which two sacrificial layers are formed on a silicon substrate, where the surface of the second sacrificial layer is lower than the top of the polysilicon gate by a certain thickness. A silicidation process is conducted to form a silicide layer on the gate structure and a side-wing polysilicon layer to lower the gate contact resistance. The side-wing polysilicon layer is formed on both sides of the gate to increase the area for a silicide formation.

SUMMARY OF THE INVENTION

Bearing in mind the problems and deficiencies of the prior art, it is therefore an object of the present invention to increase contact area to the source/drain between closely spaced gates of an integrated circuit transistor without relaxing the ground rules.

It is another object of the present invention to eliminate the need for an elongated contact for strapping the gate to a diffusion layer in an SRAM, and associated lithographic and etching issues, by bringing the source/drain contact area closer to the gate contact area.

A further object of the present invention is to decrease silicide resistance by increasing silicide area.

Yet another object of the present invention is to provide a continuous silicide etch-stop by landing the contact area fully on the silicide.

Still other objects and advantages of the invention will in part be obvious and will in part be apparent from the specification.

The above and other objects, which will be apparent to those skilled in the art, are achieved in the present invention, which is directed to a method to increase source/drain contact area of an integrated circuit transistor which is applicable to a silicon substrate having isolation structures, the method comprising: forming a gate structure on the silicon substrate having a gate conductor, shallow trench isolation structures, and ion implantations; forming polysilicon spacers adjacent each side of the gate conductors such that each of the polysilicon spacers are at a height less than the adjacent gate conductor height; and forming a conductive silicide on the polysilicon spacers that extends the source/drain contact area.

The step of forming the gate structure may include: forming a pad oxide layer on the silicon substrate; forming a pad nitride layer on the pad oxide layer; patterning the nitride layer to form a shallow trench isolation structure; stripping the pad oxide; forming a gate dielectric; depositing a gate polysilicon layer; planarizing and patterning the polysilicon layer; and etching the polysilicon layer to form the gate conductor.

The method may further include: forming extension ion implants extending from the gate conductors; depositing an etch-stop oxide layer; forming nitride spacers adjacent the gate conductor sides; forming polysilicon spacers adjacent the gate conductor sides; and performing a source/drain ion implantation process.

The polysilicon spacer height may be approximately seventy percent, fifty percent or thirty percent of the gate conductor height. An oxide etch may be performed to remove the oxide layer and expose the gate conductors and the source/drain ion implantation regions. A silicide may be formed on the exposed gate conductors and exposed source/drain ion implantation regions.

In a second aspect, the present invention is directed to a method of forming a silicided polysilicon spacer on a gate structure of an integrated circuit, comprising: forming shallow trench isolation structures on a silicon substrate; forming a pad oxide layer and a pad nitride layer on the silicon substrate; applying an inverse gate conductor lithographic mask to form gate conductors on a silicon substrate; forming trenches in the pad oxide layer, the pad nitride layer, and the shallow trench isolation structure using the inverse gate conductor lithographic mask; performing an ion implantation process for a well and a voltage threshold regions of the gate structure; forming a gate dielectric; depositing a gate polysilicon material in the trenches; stripping the pad nitride layer; forming extension ion implants extending from the gate conductors; depositing an etch-stop oxide layer; depositing a thin spacer layer; forming polysilicon spacers adjacent each side of the gate conductors such that each of the polysilicon spacers are at a height less than the adjacent gate conductor height; and forming a conductive silicide on the polysilicon spacers that extends the source/drain contact area.

In a third aspect, the present invention is directed to a method to increase the source/drain contact area of an integrated circuit transistor which is applicable to a silicon substrate having a gate structure and isolation structures, the method comprising: forming a pad oxide layer on the silicon substrate; forming a pad nitride layer on the pad oxide layer; patterning the nitride layer to form a shallow trench isolation structure; stripping the nitride layer; performing an ion implantation process for a well and a voltage threshold region of the gate structure; stripping the pad oxide; forming a gate dielectric; depositing a gate polysilicon layer; planarizing and patterning the polysilicon layer; etching the polysilicon layer to form the gate conductor; forming extension ion implants extending from the gate conductors; depositing an etch-stop oxide layer; forming nitride spacers adjacent the gate conductor sides; forming polysilicon spacers adjacent the gate conductor sides; performing a source/drain ion implantation process; performing an oxide etch to remove the oxide layer and expose the gate conductors and the source/drain ion implantation regions; performing a selective epitaxial silicon deposition; and forming a silicide on the exposed gate conductors and exposed source/drain ion implantation regions.

In a fourth aspect, the present invention is directed to an integrated circuit device having increased source/drain contact area comprising: a transistor device having a gate conductor including conductive polysilicon sidewall spacers, the spacers having a height less than seventy percent of the gate conductor height, and having a continuous surface silicide layer over deep source and drain regions.

The spacers may have a height less than fifty percent or thirty percent of the gate conductor height.

BRIEF DESCRIPTION OF THE DRAWINGS

The present invention provides a method to increase the source/drain contact area of a transistor device on an integrated circuit chip.

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
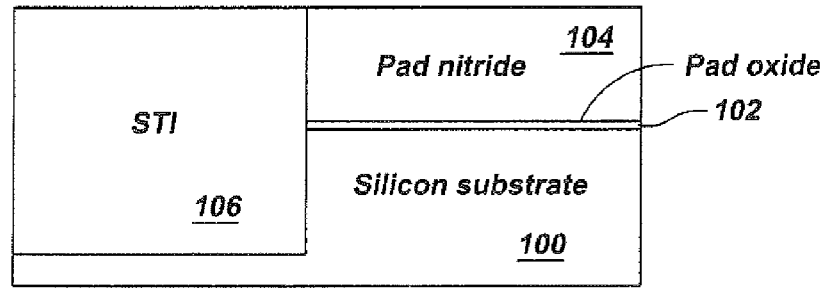
FIG. 1 is a cross-sectional view of the silicon substrate of the present invention with a pad oxide layer and a pad nitride layer deposited.

The present invention, which is directed to a method and process for forming polysilicon spacers on integrated circuit chips to enhance contact area, will now be described in greater detail by referring to the drawings that accompany the present application. In describing the preferred embodiment, reference will be made herein to FIGS. 1-27 of the drawings in which like numerals refer to like features of the invention.

In an effort to simplify the description and the drawings, the dielectric isolation between devices has been only partially shown and will not be described in detail because they are conventional. For example, shallow trench isolations may be formed in the semiconductor substrate by any number of accepted fabrication techniques known to persons of ordinary skill in the art.

Referring to FIG. 1, a pad oxide layer 102 is formed on a silicon substrate 100. Silicon substrate 100 may be formed from bulk silicon or an SOI substrate. Substrate 100 may be an n-type or p-type silicon substrate. Pad oxide layer 102 is preferably on the order of 25 angstroms thick. A pad nitride layer 104, approximate 1000 angstroms thick, is deposited on pad oxide layer 102. As will be shown in more detail herein, a thicker pad nitride layer 104 is used in order to achieve an increased shallow trench isolation step height. Shallow trench isolation structures, represented in FIG. 1 as STI 106, are formed from conventional techniques. Substrate 100, having pad oxide layer 102 and pad nitride layer 104, is first patterned, etched, filled, and then planarized to form STI 106. Well implants are either formed at this juncture, or formed before the deposition of pad nitride layer 104.

Figure 2:
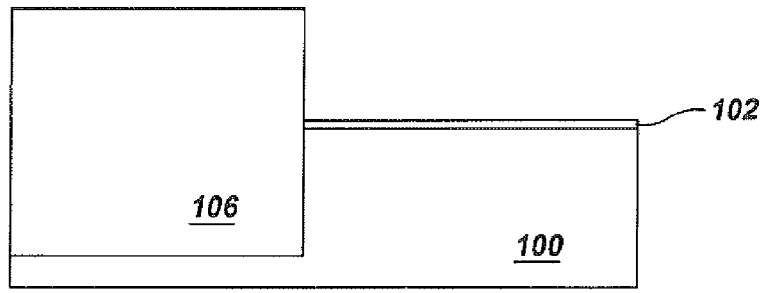
FIG. 2 is a cross-sectional view of the integrated circuit structure after the pad nitride layer is removed by etching.

A standard etching process, such as hot phosphoric acid ($H_3PO_4$), is used to strip pad nitride layer 104. FIG. 2 depicts the structure after pad nitride layer 104 is removed. Well ion implants and voltage threshold (Vt) ion implants are introduced. The implants may be n-type or p-type depending upon the makeup of the original substrate material. The structure then undergoes an anneal process. Generally, this is a rapid thermal annealing (RTA) process at a temperature that exceeds 800 degrees centigrade for activation of the implanted impurities and recovery of crystal defects.

Figure 3:
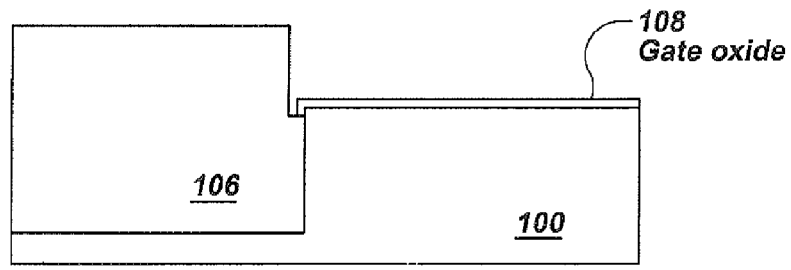
FIG. 3 is a cross-sectional view of the integrated circuit structure of FIG. 2 with the pad oxide layer stripped, and a gate oxide layer grown on the surface.
Figure 4:
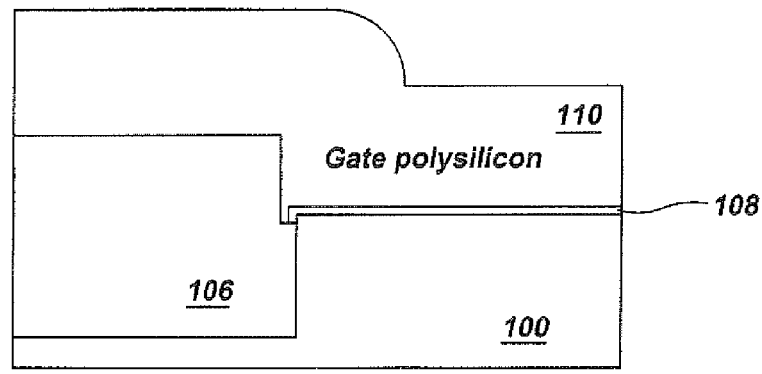
FIG. 4 is a cross-sectional view of the integrated circuit structure of FIG. 3 with a gate polysilicon layer deposited.

FIG. 3 depicts the structure of the present invention after stripping pad oxide layer 102. A gate oxide layer 108 is grown on the substrate. Gate oxide layer is grown by conventional means such as thermal oxidation followed by a nitridation step. A thick gate polysilicon 110 is then deposited on the integrated circuit structure as depicted in FIG. 4. Gate polysilicon 110 is preferably on the order of 1200 angstroms.

Figure 5:
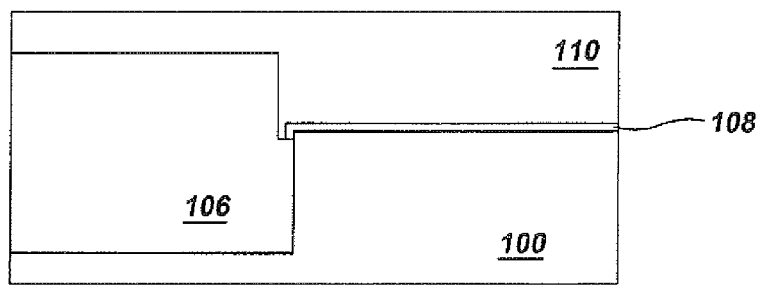
FIG. 5 is a cross-sectional view of the integrated circuit structure of FIG. 4 after polishing and planarizing.

Gate polysilicon 110 is then polished and planarized, as shown in FIG. 5. The polysilicon layer is desirably thicker over the silicon and thinner over STI 106. The polishing and planarizing is preferably achieved by a standard CMP process.

Figure 6:
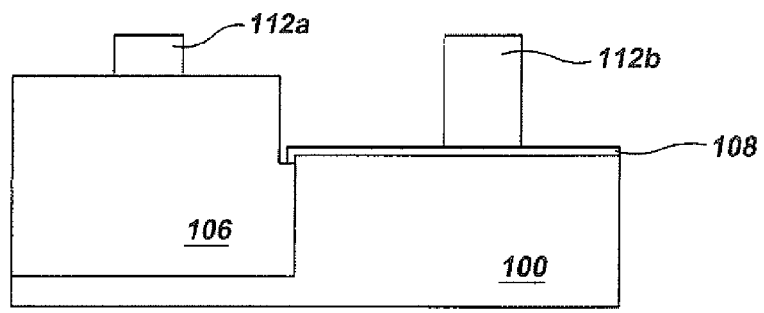
FIG. 6 is a cross-sectional view of the integrated circuit structure of FIG. 5 with gate conductors patterned and deposited on the top surface.

Referring to FIG. 6, gate conductors 112 are added to the integrated circuit structure. Typical lithographic processes may be employed to form gate conductors 112a,b. Gate conductor material is deposited, a lithographic pattern is formed, and the gate stack is etched to establish the conductor footprint. The etching process is regulated to stop at oxide layer 108. As indicated, gate conductor 112a is preferably made to be the same height as gate conductor 112b. It is desirable to have the gate conductors at a similar height, or same top level, when fabricating the integrated circuit structure.

Figure 7:
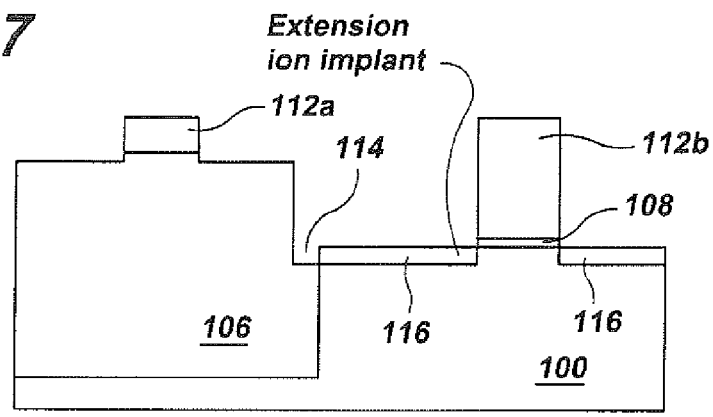
FIG. 7 is a cross-sectional view of the integrated circuit structure of FIG. 6 with the oxide layer etched and extension ion implants deposited.

The remaining portion of oxide layer 108 is then etched, preferably by an RIE process, and the integrated circuit structure is cleaned. As shown in FIG. 7, the gate sidewall oxidation will result in an offset spacer 114, preferably having a width on the order of 35 angstroms. Extension ion implants 116 are then performed by processes known in the art.

Figure 8:
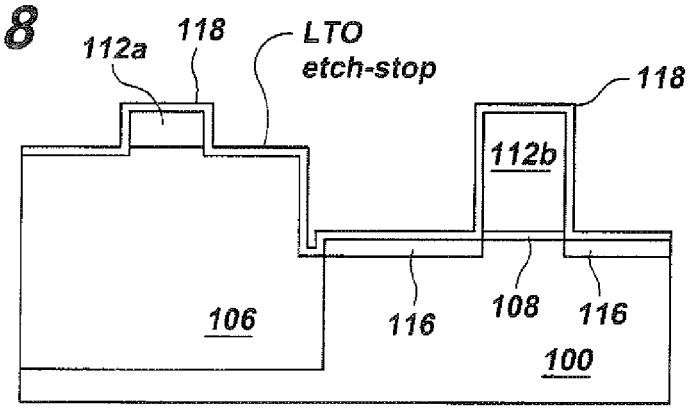
FIG. 8 is a cross-sectional view of the integrated circuit structure of FIG. 7 with an oxide layer etch stop deposited on the structure.

Referring to FIG. 8, an oxide layer 118 is deposited over the entire structure to be used as an etch stop for the deposition of a polysilicon spacer. Oxide layer 118 is preferably on the order of 50 angstroms.

Figure 9:
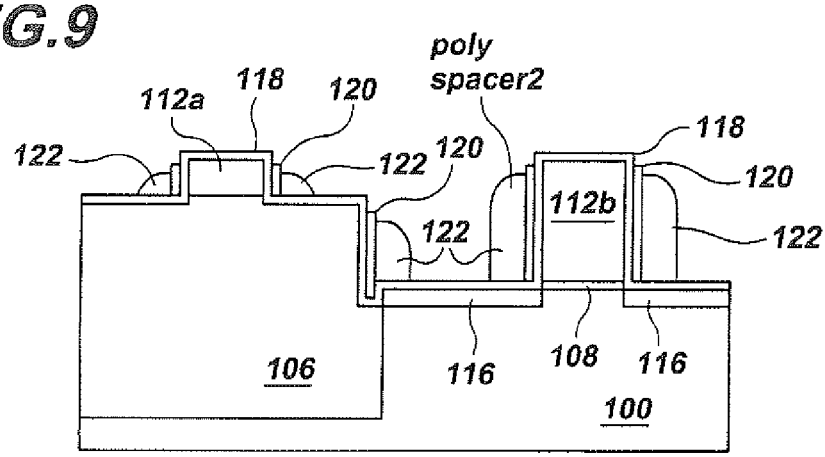
FIG. 9 is a cross-sectional view of the integrated circuit structure of FIG. 8 depicting the deposition of nitride and polysilicon spacers after patterning and etching.

A thin dielectric spacer 120, preferably made from nitride or a low dielectric constant material such as SiCOH, is formed on the side of gate conductors 112a,b as depicted in FIG. 9. Polysilicon spacers 122 are deposited and patterned by an RIE process. The thickness of spacers 122 should be on the order of 500 angstroms after etching. As shown, the height of spacers 122 is adjusted to be just below the top of each gate conductor 112a,b. Preferably, the height of spacers 122 is approximately 5-10 nm below the top of the gate conductor.

Figure 10:
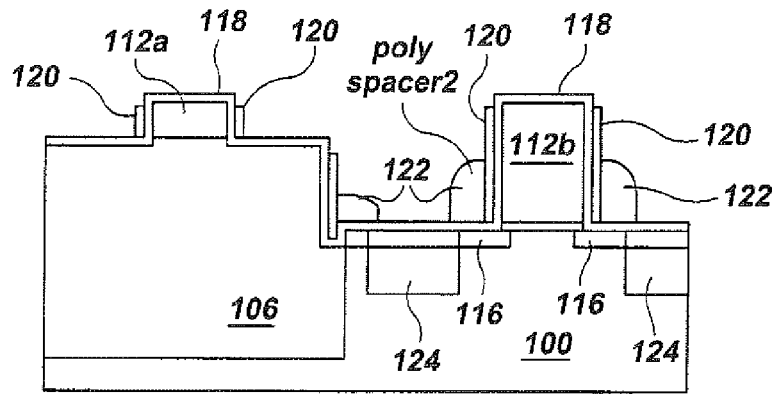
FIG. 10 is a cross-sectional view of the integrated circuit structure of FIG. 9 with source/drain ion implantation regions formed.

Source/drain ion implantation regions 124 are formed, and the structure is annealed, as depicted in FIG. 10. Importantly, polysilicon spacers 122 are shortened, or pulled down, through an etching process, such as an RIE process, so that the larger spacers 122 are at approximately one third to one-half of the gate conductor height, preferably less than seventy percent of the gate conductor height, and the smaller spacers that were adjacent to the shorter gate conductor 112a are completely removed from the isolation region, exposing nitride spacer 120.

Figure 11:
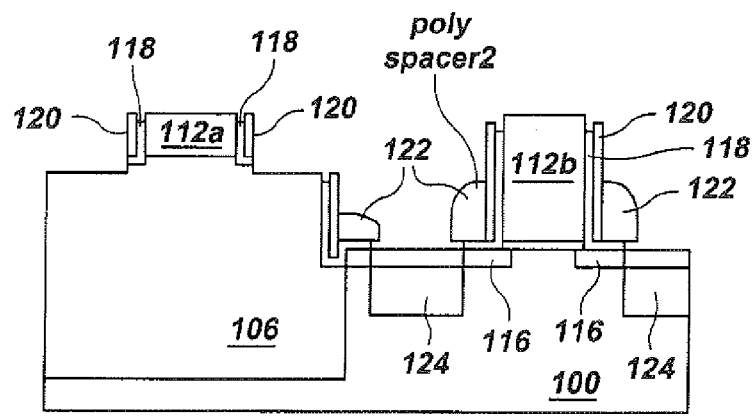
FIG. 11 is a cross-sectional view of the integrated circuit structure of FIG. 10 after an oxide etch is performed to expose portions of the silicon substrate.
Figure 12:
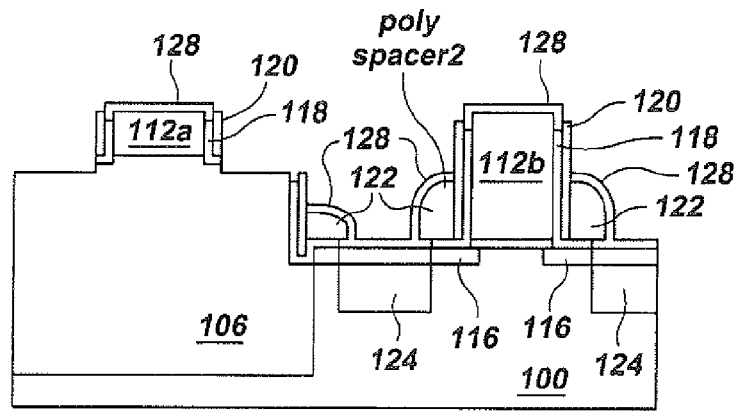
FIG. 12 is a cross-sectional view of the integrated circuit structure of FIG. 11 with a selective epitaxial silicon deposition and a self-aligned nickel silicide layer.

Referring to FIG. 11, an oxide etch is performed to expose gate conductors 112a,b and silicon substrate 100. Selective epitaxial silicon deposition is performed on the structure as depicted in FIG. 12, and a conductive silicide layer 128, such as nickel silicide, is sputter deposited and annealed on the surface. Nickel silicide 128 reacts with the silicon in a self-aligned silicide process. The silicide formation is completed as depicted in FIG. 13 with the deposition of a conductive material, such as NiPt in a salicide process.

Figure 13:
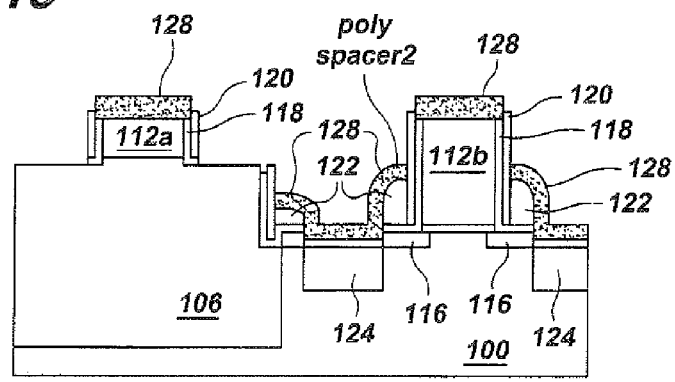
FIG. 13 is a cross-sectional view of the integrated circuit structure of FIG. 12 showing the completion of the silicide formation with the deposition of a conductive material in a salicide process.
Figure 14:
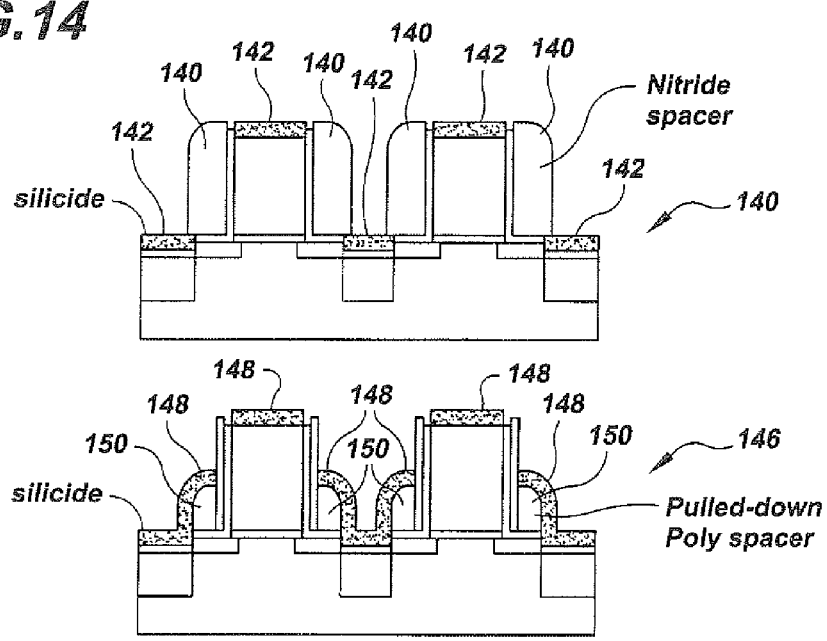
FIG. 14 depicts a cross-sectional view of two silicon substrates to illustrate a comparison of contact area for closely spaced poly lines between prior art structures and a structure formed using the method of the present invention.
Figure 15:
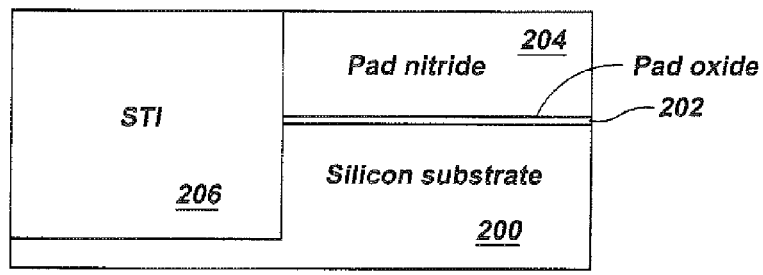
FIG. 15 is a cross-sectional view of the second embodiment of the present invention depicting a silicon substrate with a pad oxide layer and a pad nitride layer deposited, and a formed shallow trench isolation structure.

As depicted in FIG. 13, the footprint of the NiPt layer is increased over the half-sized poly silicon spacers, enlarging the contact area of each integrated circuit device. Based on the preferred embodiment of the present invention, the present invention comprises the following advantages: an increased contact area to the source/drain between closely spaced gates of an integrated circuit transistor that is formed without relaxing the ground rules; an elimination of the need for an elongated contact for strapping the gate to a diffusion layer by bringing the source/drain contact area closer to the gate contact area; and a decrease in the silicide resistance through an increase in the silicide area, to name a few. FIG. 14 depicts a comparison of contact area for closely spaced poly lines. Structure 140 has prior art silicide portions 142 between nitride spacers 144. Structure 146 depicts the transistor after the methodology of the present invention is employed. Silicide contact area 148 is shown covering the shortened, or pulled-down polysilicon spacers 150. The contact area of the present invention, as shown in structure 146, is comparatively greater than the contact area depicted in the prior art of structure 140.

Figure 16:
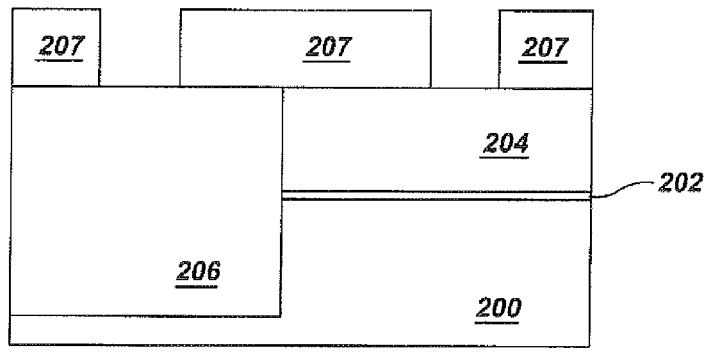
FIG. 16 is a cross-sectional view of the integrated circuit structure of FIG. 15 where a lithographic mask is applied to the structure.
Figure 17:
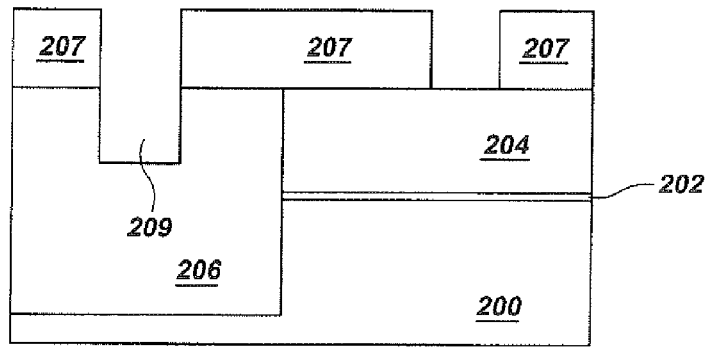
FIG. 17 is a cross-sectional view of the integrated circuit structure of FIG. 16 depicting the formation of a trench within the STI.

In a second embodiment, a silicided polysilicon spacer is used with an inlaid gate interconnect to enhance the contact area of the transistor. In a similar fashion to the commencement of the first preferred embodiment, referring to FIG. 15, a pad oxide layer 202 is formed on a silicon substrate 200. Silicon substrate 200 may be formed from bulk silicon or an SOI substrate. Substrate 200 may be an n-type or p-type silicon substrate. Pad oxide layer 202 is preferably on the order of 25 angstroms thick. A pad nitride layer 204, approximate 1000 angstroms thick, is deposited on pad oxide layer 202. A shallow trench isolation structure 206 is formed by typical processes that include patterning, etching, filling, and planarizing. A lithographic mask 207 is next applied to the structure as depicted in FIG. 16. The lithographic mask forms an inverse gate conductor pattern. A trench 209 is formed within STI 206 using lithographic mask 207. Trench 209 is preferably formed using an oxide RIE process, although other conventional trench-forming processes may be employed. FIG. 17 depicts the formation of trench 209.

Figure 18:
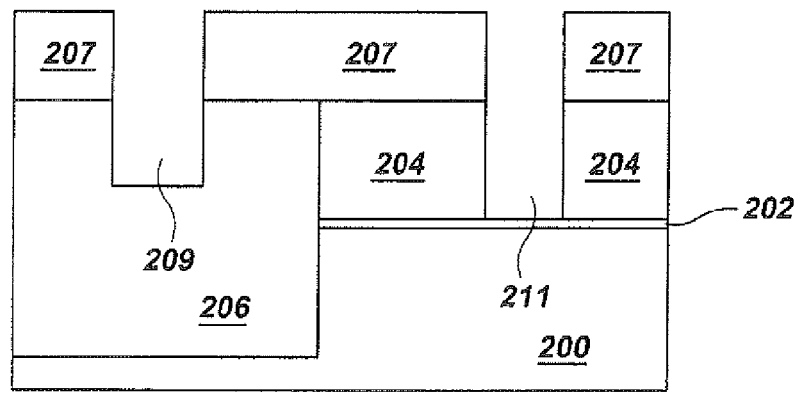
FIG. 18 is a cross-sectional view of the integrated circuit structure of FIG. 17 depicting the formation of an opening within the pad nitride layer.
Figure 19:
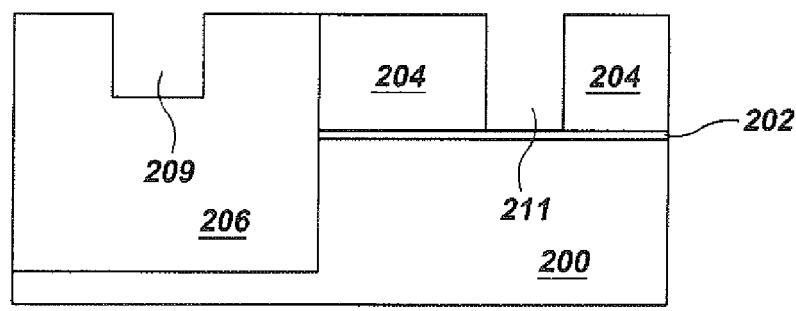
FIG. 19 is a cross-sectional view of the integrated circuit structure of FIG. 18 with the lithographic mask removed and ion implantations formed.
Figure 20:
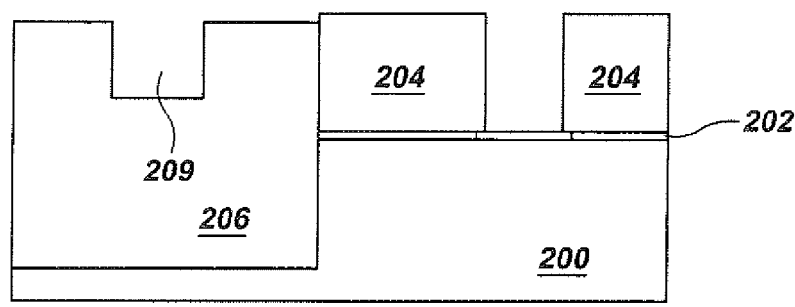
FIG. 20 is a cross-sectional view of the integrated circuit structure of FIG. 19 after an oxide etch is performed to remove a portion of the pad oxide layer, and decrease or recess the height of the shallow trench isolation structure.
Figure 21:
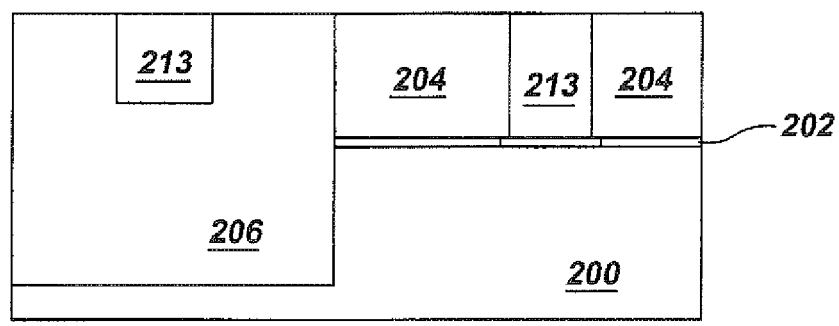
FIG. 21 is a cross-sectional view of the integrated circuit structure of FIG. 20 depicting the deposition of a polysilicon gate material that is then subjected to chemical-mechanical polishing and planarization.
Figure 22:
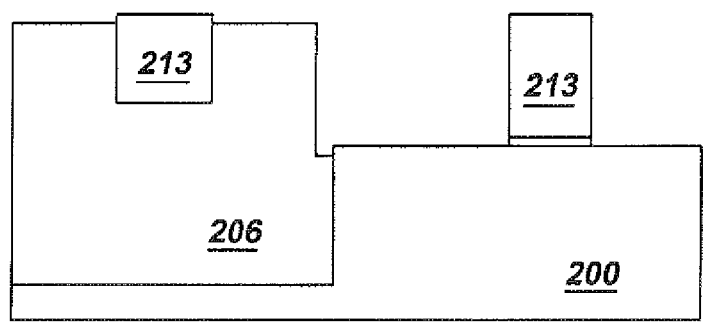
FIG. 22 is a cross-sectional view of the integrated circuit structure of FIG. 21 with pad oxide and pad nitride layers stripped away.

An opening 211 is formed in pad nitride 204 by a nitride RIE process that uses pad oxide 202 as the etch stop. FIG. 18 depicts the formation of opening 211 in pad nitride layer 204. Next, as depicted in FIG. 19, lithographic mask 207 is removed and shallow ion implantations 212 are made. Referring to FIG. 20, an oxide etch is performed that removes that portion of pad oxide layer 202 in opening 211, and decreases or recesses the height of shallow trench isolation structure 206. The polysilicon gate material 213 is then deposited via a damascene process, and subjected to chemical-mechanical polishing and planarization, as shown in FIG. 21. Pad oxide 202 and pad nitride 204 layers are then stripped through general process methods known in the art. The resultant structure is depicted in FIG. 22.

Figure 23:
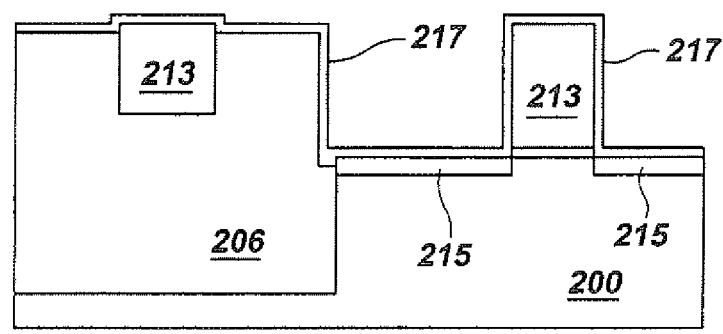
FIG. 23 is a cross-sectional view of the integrated circuit structure of FIG. 22 with ion implantations and an oxide layer deposited.

Similar to the first embodiment, a gate sidewall oxidation is performed and extension ion implants 215 are applied to the structure. An oxide layer 217 is then deposited to be used as an etch-stop for the polysilicon spacer. FIG. 23 depicts the current configuration of the integrated circuit structure.

Figure 24:
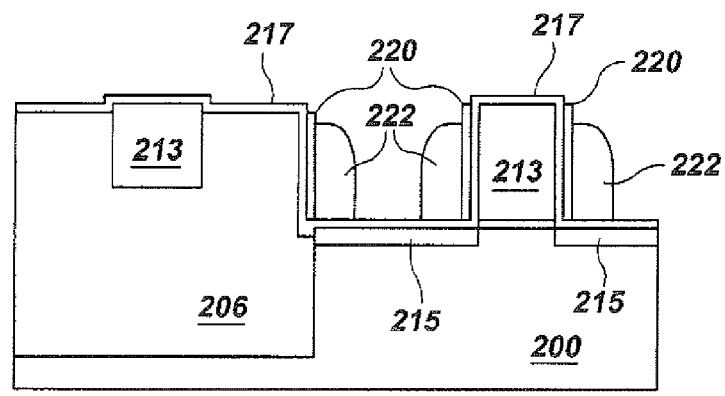
FIG. 24 is a cross-sectional view of the integrated circuit structure of FIG. 23 with a thin low-dielectric spacer formed on the side of the gate conductors, and polysilicon spacers deposited and patterned.

As shown in FIG. 24, a thin dielectric spacer 220, preferably made from nitride or a low dielectric constant material such as SiCOH, is formed on the side of the gate conductors. Polysilicon spacers 222 are deposited and patterned by an RIE process. The thickness of spacers 222 should be on the order of 500 angstroms after etching. As shown, the height of spacers 222 is adjusted to be just below the top of each gate conductor. Preferably, the height of spacers 222 is approximately 5-10 nm below the top of the gate conductor.

Figure 25:
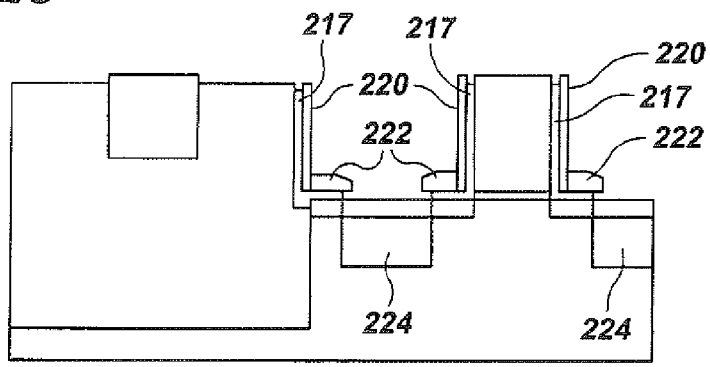
FIG. 25 is a cross-sectional view of the integrated circuit structure of FIG. 24 after an oxide etch is performed to expose portions of the silicon substrate.

Source/drain ion implantation regions 224 are formed, and the structure is annealed, as depicted in FIG. 25. Importantly, polysilicon spacers 222 are shortened, or pulled down, through an etching process, such as a RIE process. In this process, the aspect ratio is reduced to minimize capacitance and enhance the stress liner proximity effects.

Figure 26:
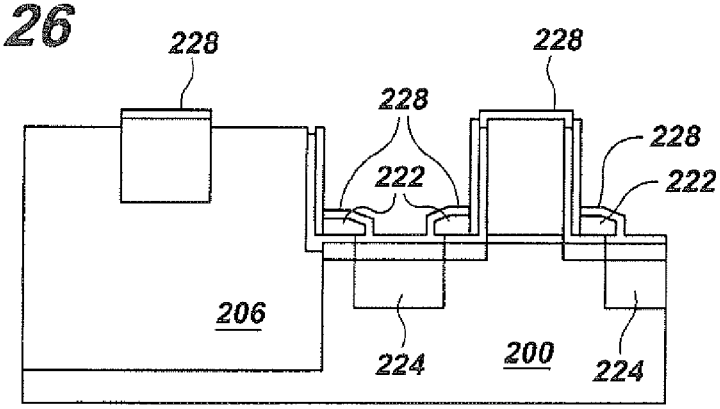
FIG. 26 is a cross-sectional view of the integrated circuit structure of FIG. 25 with a selective epitaxial silicon deposition and a self-aligned nickel silicide layer.
Figure 27:
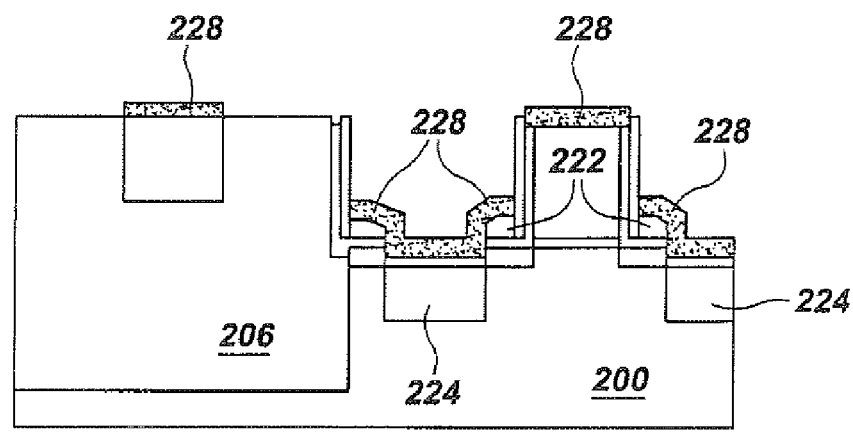
FIG. 27 is a cross-sectional view of the integrated circuit structure of FIG. 26 showing the completion of the silicide formation with the deposition of a conductive material in a salicide process.

Referring to FIG. 25, an oxide etch is performed to expose gate conductor and silicon substrate 200. Selective epitaxial silicon deposition is performed on the structure as depicted in FIG. 26, and a conductive silicide layer 228, such as nickel silicide, is sputter deposited and annealed on the surface. Nickel silicide 228 reacts with the silicon in a self-aligned silicide process. The silicide formation is completed as depicted in FIG. 27 with the deposition of a conductive material, such as NiPt in a salicide process.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An integrated circuit device having increased source/drain contact area comprising:
   a transistor device having a gate conductor including conductive polysilicon sidewall spacers, said conductive polysilicon sidewall spacers having a reduced height of less than fifty percent of said gate conductor height;
   including a dielectric spacer between said gate conductor and said conductive polysilicon sidewall spacers, wherein said dielectric spacer is selected from nitride or a low dielectric constant material such as SiCOH; and
   having a continuous conductive surface silicide layer on said conductive polysilicon sidewall spacers having said reduced height and over deep source and drain regions to extend said source/drain contact area.

2. A method to increase source/drain contact area of an integrated circuit transistor which is applicable to a silicon substrate having isolation structures, said method comprising:
   forming a gate structure on said silicon substrate having a gate conductor, shallow trench isolation structures, and ion implantations comprising the steps;
   forming a pad oxide layer on said silicon substrate;
   forming a pad nitride layer on said pad oxide layer;
   patterning said nitride layer to form a shallow trench isolation structure;
   stripping said nitride layer using a hot phosphoric acid process;
   performing an ion implantation process for a well and a voltage threshold region of said gate structure, wherein said gate structure is subjected to rapid thermal annealing after said ion implantation;
   stripping said pad oxide;
   forming a gate dielectric;
   depositing a gate polysilicon layer;
   planarizing and patterning said gate polysilicon layer;
   etching said gate polysilicon layer to form said gate conductor;
   forming extension ion implants extending from said gate conductor;
   depositing an etch-stop oxide layer;
   forming nitride spacers adjacent said gate conductor sides;
   forming conductive polysilicon spacers along side of said nitride spacers and adjacent each side of said gate conductor sides;
   performing a source/drain ion implantation process;
   shortening said conductive polysilicon spacers by etching such that at least one of said conductive polysilicon spacers is at a height less than a height of said adjacent gate conductor, wherein said height of said at least one conductive polysilicon spacer is thirty percent, fifty percent, or seventy percent of said gate conductor height
   performing an oxide etch to remove said etch-stop oxide layer and expose said gate conductor and said source/drain ion implantation regions;
   performing a selective epitaxial silicon deposition; and
   forming a conductive silicide on said exposed gate conductor, on said shortened conductive polysilicon spacers and on said exposed source/drain ion implantation regions to extend said source/drain contact area.

* * * * *